(12) United States Patent
Tao et al.

(10) Patent No.: US 6,844,139 B2
(45) Date of Patent: Jan. 18, 2005

(54) METHOD FOR FORMING A LITHOGRAPHIC PRINTING PLATE

(75) Inventors: Ting Tao, Fort Collins, CO (US); Jeffrey James Collins, Greeley, CO (US); Thomas Jordan, Windsor, CO (US)

(73) Assignee: Kodak Polychrome Graphics, LLC

( * ) Notice: Subject to any disclaimer, the term of this patent is extended or adjusted under 35 U.S.C. 154(b) by 204 days.

(21) Appl. No.: 10/336,595

(22) Filed: Jan. 3, 2003

(65) Prior Publication Data

US 2004/0131973 A1 Jul. 8, 2004

(51) Int. Cl.$^7$ ............... G03F 7/021; B41M 5/00
(52) U.S. Cl. ............ 430/302; 430/158; 430/163; 430/270.1; 101/467
(58) Field of Search ............. 430/158, 163, 430/270.1, 302

(56) References Cited

U.S. PATENT DOCUMENTS

| | | | |
|---|---|---|---|
| 5,372,907 A | 12/1994 | Haley et al. | 430/157 |
| 5,466,557 A | 11/1995 | Haley et al. | 430/278 |
| 5,763,134 A | 6/1998 | Busman et al. | 430/157 |
| 5,919,601 A | 7/1999 | Nguyen et al. | 430/278.1 |
| 5,965,319 A | 10/1999 | Kobayashi | 430/176 |
| 6,159,657 A * | 12/2000 | Fleming et al. | 430/270.1 |
| 6,309,792 B1 | 10/2001 | Hauck et al. | 430/270.1 |
| 6,410,203 B1 | 6/2002 | Nakamura | 430/270.1 |
| 6,537,730 B1 * | 3/2003 | Fleming et al. | 430/302 |
| 6,673,510 B1 * | 1/2004 | Nakamura et al. | 430/270.1 |
| 2001/0031423 A1 | 10/2001 | Kita | |
| 2002/0068241 A1 | 6/2002 | Oohashi et al. | 430/288.1 |

FOREIGN PATENT DOCUMENTS

| | | |
|---|---|---|
| EP | 0784 233 A1 | 7/1997 |
| EP | 1260 362 A2 | 11/2002 |
| JP | 10-153853 | 6/1998 |
| JP | 2002-049147 | 2/2002 |
| WO | WO 00/17711 | 3/2000 |

OTHER PUBLICATIONS

Database WPI, Section Ch, Week 199833, Derwent Publications Ltd., London, GB, AN 1998–382456, XP002282637 & JP 10 153853 A (Konica Corp) Jun. 9, 1998.

Database WPI, Section Ch, Week 199847, Derwent Publications Ltd., London, GB; AN 1998–546325, XP002282636 & JP 10 239834 A (Konica Corp) Sep. 11, 1998.

* cited by examiner

Primary Examiner—John S. Chu
(74) Attorney, Agent, or Firm—RatnerPrestia

(57) ABSTRACT

Methods for forming images are disclosed. The images are formed by imaging and developing an imageable element comprising a layer of an imageable composition over a substrate. The imageable composition contains a polymeric binder, an acid activatable crosslinking agent, and an acid generator of the structure:

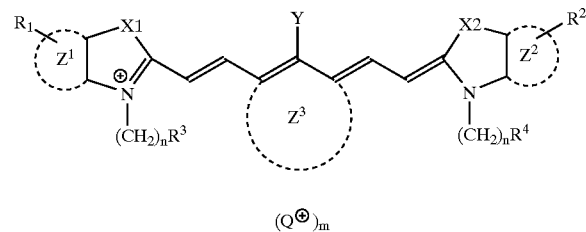

in which:

Y is hydrogen, halo, alkyl, diphenylamino, phenylthio, or $(CH_2)_k SO_3^-$ in which k is 1 to 4;

$R^1$, $R^2$, $R^3$, and $R^4$, are each independently hydrogen or $SO_3^-$ with the proviso that the anion has two to four $SO_3^-$ groups;

$Z^1$ and $Z^2$ are each independently a benzo group or a naphtho group;

$Z^3$ is two hydrogen atoms, a cyclohexene residue or a cyclopentene residue;

X1 and X2 are each independently S, O, NH, $CH_2$, or $CMe_2$;

$Q^\oplus$ is an onium cation;

n is 1 to 4; and m is 1 to 3, with the proviso that m is 1 when the anion has two $SO_3^-$ groups; m is 2 when the anion has three $SO_3^-$ groups; and m is 3 when the anion has four $SO_3^-$ groups.

19 Claims, No Drawings

METHOD FOR FORMING A LITHOGRAPHIC PRINTING PLATE

FIELD OF THE INVENTION

This invention relates to methods for forming images, especially to methods for forming images useful as lithographic printing plates.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically, comprise a top layer applied over the surface of a hydrophilic substrate. The top layer includes one or more radiation-sensitive components, which may be dispersed in a suitable binder. Alternatively, the radiation-sensitive component can also be the binder material.

If after exposure to radiation, the exposed regions are removed in the developing process, revealing the underlying hydrophilic surface of the substrate, the plate is called a positive-working printing plate. Conversely, if the unexposed regions are removed by the developing process and the exposed regions remain, the plate is called a negative-working plate. In each instance, the regions of the hydrophilic surface revealed by the developing process accept water, typically a fountain solution, and the regions of the radiation-sensitive layer (i.e., the image areas) that remain repel water and accept ink.

Direct digital imaging of offset printing plates, which obviates the need for exposure through a negative, is becoming increasingly important in the printing industry. Negative-working, alkaline developable imageable elements that comprise compounds that form an acid on thermal imaging have been developed for use with infrared lasers. For example, Haley, U.S. Pat. No. 5,372,907, discloses a radiation-sensitive composition that is sensitive to both ultraviolet and infrared radiation. The composition comprises (1) a resole resin, (2) a novolac resin, (3) an acid generator, and (4) an infrared absorber. Typically, the acid generators are onium compounds, such as 2-methoxy-4-aminophenyl diazonium hexafluorophosphate, phenoxyphenyldiazonium hexafluoroantimonate, anilinophenyldiazonium hexafluoroantimonate, bis-4-dodecylphenyliodonium hexafluoro antimonate, diphenyliodonium hexafluorophosphate, diphenyl iodonium hexafluoroantimonate, diphenyl iodonium hexafluoroarsenate, dicumyliodonium hexafluorophosphate, and triphenylsulfonium hexafluoroantimonate.

Although acid generation in these systems is relatively efficient with ultraviolet imaging, it is inefficient with infrared (830 nm to 1200 nm) imaging.

Because the compositions comprise four components, formulation of the composition is complicated. The acid generators are typically onium salts in which the anion contains an element such as antimony or arsenic, producing handling and disposal problems. Thus, a need exists for a more efficient method for forming images by direct digital imaging with infrared radiation and in which the acid generator does not contain elements, such as antimony or arsenic, that present handling and disposal problems.

SUMMARY OF THE INVENTION

In one aspect, the invention is a method for forming an image, the method comprising, in the order given, the steps of:

a) imaging an imageable element and forming an imaged imageable element comprising unimaged regions and complementary imaged regions, and b) developing the imaged imageable element and removing the unimaged regions but not the complementary imaged regions;

in which:

the imageable element comprises a substrate, and a layer of a negative working imageable composition over the substrate, the negative working imageable composition comprises:

a polymeric binder;

an acid activatable crosslinking agent; and an acid generator of the structure:

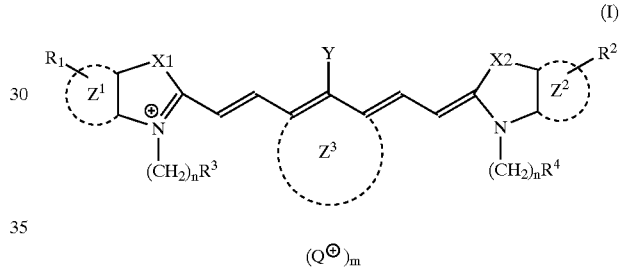

(I)

in which:

Y is hydrogen, halo, alkyl, diphenylamino, phenylthio, or $(CH_2)_kSO_3^-$ in which k is 1 to 4;

$R^1$, $R^2$, $R^3$, and $R^4$, are each independently hydrogen or $SO_3^-$ with the proviso that the anion has two to four $SO_3^-$ groups;

$Z^1$ and $Z^2$ are each independently a benzo group or a naphtho group;

$Z^3$ is two hydrogen atoms, a cyclohexene residue or a cyclopentene residue;

X1 and X2 are each independently S, O, NH, $CH_2$, or $CMe_2$;

$Q^\oplus$ is an onium cation;

n is 1 to 4; and m is 1 to 3, with the proviso that m is 1 when the anion has two $SO_3^-$ groups; m is 2 when the anion has three $SO_3^-$ groups; and m is 3 when the anion has four $SO_3^-$ groups.

In one aspect, the element is heated after step a) and before step b). Optionally, the element may be baked after step b).

In another aspect, the invention is an imaged imageable element useful as a lithographic printing plate formed by imaging and developing the imageable element.

The compositions used in the invention have greater sensitivity to infrared radiation. Formulation is simplified because the compositions do not require separate acid generators and infrared absorbers (photothermal conversion materials), thus reducing the number of components in the composition. The compositions do not contain elements, such as antimony or arsenic, that present handling and disposal problems.

DETAILED DESCRIPTION OF THE INVENTION

Unless the context indicates otherwise, in the specification and claims, the terms novolac resin, resole resin, polymeric binder; acid activatable crosslinking agent; acid generator, and similar terms include mixtures of such materials. Unless otherwise specified, all percentages are percentages by weight.

Imageable Element

The imageable element comprises a layer of a negative working imageable composition over a substrate. Other layers that are conventional components of imageable elements may also be present.

Negative Working Imageable Composition

The negative working imageable composition comprises an acid generator, an acid activatable crosslinking agent, and a polymeric binder. Other ingredients that are conventional ingredients of negative working imageable compositions may also be present.

Acid Generator

The acid generator is a compound of structure (I). It comprises an anion that absorbs ultraviolet, visible, and/or infrared radiation and an onium cation ($Q^{\oplus}$). Preferably, the anion absorbs infrared (830 nm to 1200 nm) radiation. The anion has two to four $SO_3^-$ groups. Depending on the number of $SO_3^-$ groups present in the anion, one to three onium cations are necessary to maintain charge neutrality.

$Q^{\oplus}$ is an onium cation. The onium cation can be, for example, iodonium, sulfonium, diazonium, phosphonium, ammonium, bromonium, oxysulfoxonium, oxysulfonium, sulfoxonium, selenonium, or arsonium. Although the cation may be a selenonium, or arsonium cation, these cations are not preferred because they present handling and disposal problems. $Q^{\oplus}$ is preferably a diazonium, iodonium, or sulfonium cation. Typical cations are 2-methoxy-4-(phenylamino)-benzenediazonium, mesityl diazonium, dodecylphenyl diazonium, phenylphenyl diazonium, naphthyl diazonium, anthracenyl diazonium, methoxyphenyl diazonium, phenoxyphenyl diazonium, anilinophenyl diazonium, anilinocarbonylphenyl diazonium, phenylazophenyl diazonium, methoxynaphthyl diazonium, diphenyliodonium, bis-4-dodecylphenyliodonium, dicumyliodonium, and triphenylsulfonium.

$R^1$, $R^2$, $R^3$, and $R^4$ are each independently hydrogen or $SO_3^-$. However, between two and four $SO_3^-$ groups are present in the anion. In one preferred embodiment, two of these groups are $SO_3^-$. In another preferred embodiment, all four of these groups are $SO_3^-$.

$Z^1$ and $Z^2$ are each independently a benzo group or a naphtho group, that is, $Z^1$ and $Z^2$ each independently represent either a benzo moiety or a naphtho moiety.

$Z^3$ is two hydrogen atoms, a cyclohexene residue or a cyclopentene residue. That is, $Z^3$ may represent either a cyclohexene ring or a cyclopentene ring. Alternatively, the compound may be an open chain compound, in which $Z^3$ is two hydrogen atoms. In this case the structure is represented by —CH=C(Y)—CH=.

X1 and X2 are each independently S, O, NH, $CH_2$, or $CMe_2$. Typically, X1 and X2 are each $CMe_2$.

Y is hydrogen, halo, alkyl, diphenylamino, phenylthio, or $(CH_2)_kSO_3^-$. Typical halo groups are chloro and bromo. Typical alkyl groups are alkyl groups of one to four carbon atoms, such as methyl, ethyl, i-propyl, n-propyl, t-butyl and n-butyl. k is one to four, typically two or four. Typically, Y is hydrogen, chloro, phenylthio, or diphenylamino.

In one embodiment, $R^1$ and $R^2$ are the same; $R^3$ and $R^4$ are the same; $Z^1$ and $Z^2$ are the same; X1 and X2 are the same; and $(CH_2)_nR^3$ and $(CH_2)_nR^4$ are the same.

The acid generators may be prepared by mixing an onium salt and a salt containing the radiation absorbing anion in a solvent, and filtering off the precipitate. The starting onium salt may have non-nucleophilic anion, such as, fluoride, chloride, bromide, iodide, sulfate, bisulfate, tetrafluoroborate, hexafluorophosphate, hexafluoroarsenate, hexafluoroantimonate, tetrakis(pentafluorophenyl)borate, triflate, pentafluoroethyl sulfonate, p-methyl-benzyl sulfonate, ethyl sulfonate, trifluoromethyl acetate, or pentafluoroethyl. The salt containing the radiation absorbing anion is typically an ammonium, substituted ammonium, lithium, sodium, or potassium salt. The solvent may be water or a solvent including a mixture of water and a hydrophilic solvent such as alcohol.

Polymeric Binder and Acid-activatable Crosslinking Agent

The negative working imageable composition comprises a polymeric binder and an acid-activatable crosslinking agent. It is believed that the polymeric binder undergoes acid catalyzed thermal crosslinking by the crosslinking agent when the imageable element is heated after imaging.

Acid-activatable crosslinking agents may comprise at least two acid-activatable reactive groups, such as the hydroxymethyl group, the alkoxymethyl group, the epoxy group, and vinyl ether group, bonded to an aromatic ring. Examples include methylol melamine resins, resol resins, epoxidized novolac resins, and urea resins. Other examples are amino resins having at least two alkoxymethyl groups (e.g. alkoxymethylated melamine resins, alkoxymethylated glycolurils and alkoxymethylated benzoguanamines). Phenol derivatives comprising at least two groups such as the hydroxymethyl group and/or the alkoxymethyl group provide good fastness in an image portion when an image is formed. Examples of phenol derivatives include resol resins. Resole resins include, for example, GP649D99 resole (Georgia Pacific) and BKS-5928 resole resin (Union Carbide).

Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. A useful novolac resin for use in this invention is the resin prepared from m-cresol and formaldehyde.

Resole resins are obtained by reaction of phenolic compounds with aldehydes, but under different reaction conditions than those that produce novolac resins. A typical example of a resole resin useful with novolac resins is the resol resin prepared from bis-phenol A and formaldehyde.

The acid activatable crosslinking agent used in the composition may depend on the polymeric binder. Any combination of acid activatable crosslinking agent and polymeric binder that react to from a crosslinked binder under the imaging conditions may be used. Various combinations of polymeric binder and acid activatable crosslinking agent are known in the art. In general, the binder is a polymer, or mixture of polymers, capable of undergoing an acid-catalyzed condensation reaction with the crosslinking agent when the element is heated to 60–220° C.

For example, Haley, U.S. Pat. No. 5,372,907, incorporated herein by reference, discloses a radiation-sensitive composition that is sensitive to both ultraviolet/visible and infrared radiation. The composition comprises a resole resin and a novolac resin. In these compositions, the novolac resin is the polymeric binder and the resole resin is the acid-activatable crosslinking agent.

Nguyen, U.S. Pat. No. 5,919,601, incorporated herein by reference, discloses radiation-sensitive compositions imageable by infrared and ultraviolet/visible radiation. These compositions comprise a polymeric binder containing reactive pendant groups selected from hydroxy, carboxylic acid, sulfonamide, and alkoxymethylamides; and a resole resin, a $C_1$–$C_5$ alkoxymethyl melamine or glycoluril resin, a poly($C_1$–$C_5$-alkoxy-methylstyrene), a poly($C_1$–$C_5$-alkoxymethylacrylamide), a derivative thereof, or a combination thereof. Preferably, the crosslinking resin is a resole resin prepared from a $C_1$–$C_5$ alkylphenol and formaldehyde; a tetra $C_1$–$C_5$-alkoxymethyl glycoluril; a polymer of (4-methoxymethylstyrene); a polymer of (N-methoxymethyl) acrylamide; a polymer of (N-i-butoxymethyl)acrylamide; or a butylated phenolic resin.

Kobayashi, U.S. Pat. No. 5,965,319, incorporated herein by reference, discloses a negative working recording material comprising an acid activatable crosslinking agent, preferably having at least two hydroxymethyl or alkoxymethyl groups bonded to a benzene ring and a polymer compound having an alkaline-soluble group such as a novolac resin. Typical crosslinking agents are phenols containing hydroxymethyl groups, prepared by condensation of phenols with formaldehyde.

Busman, U.S. Pat. No. 5,763,134, incorporated herein by reference, discloses activatable crosslinking agents, such as 1,3,5-trihydroxymethylbenzene, 1,3,5-triacetoxymethylbenzene, and 1,2,4,5-tetraacetoxymehylbenzene. Other polymeric binders and acid activatable crosslinking agents will be apparent to those skilled in the art.

Other Ingredients

The imageable composition may also comprise other ingredients such as dyes and surfactants that are conventional ingredients of imageable compositions. Surfactants may be present in the imageable composition as, for example, coating aids. A dye may be present to aid in the visual inspection of the exposed and/or developed element. Printout dyes distinguish the exposed regions from the unexposed regions during processing. Contrast dyes distinguish the unimaged regions from the imaged regions in the developed imageable element. Preferably the dye does not absorb the imaging radiation. Triarylmethane dyes, such as ethyl violet, crystal violet, malachite green, brilliant green, Victoria blue B, Victoria blue R, and Victoria pure blue BO, may act as a contrast dye.

Substrate

The negative working photosensitive composition may be coated onto a wide variety of substrates. By "substrate" is meant any natural or synthetic support. The particular substrate will generally be determined by the intended application. Examples of substrates include metals such as aluminum, zinc, titanium, steel, copper, and alloys thereof; alumina-blasted aluminum, anodized aluminum, alumina-blasted polyethylene terephthalate film, polyethylene terephthalate film, e.g., resin-subbed polyethylene terephthalate film, polyvinyl alcohol-coated paper, crosslinked polyester-coated paper, nylon, glass, cellulose acetate film, and heavy paper such as lithographic paper. The photosensitive compositions are especially suited for use in the production of lithographic printing plates and in the field of photoresist technology.

For photoresist applications, the substrate may be a polymer sheet or film, such as a polyethylene terephthalate film. The photosensitive composition is coated or laminated onto the polymer film. While the thickness of the layer will depend on the intended application, for dry film photoresists the coating should have a thickness of about 5 to 100 microns, preferably 13 to 50 microns, when dry. For protection, a coversheet may be placed over the layer of photosensitive composition after the solvent evaporates.

After removal of the release film, the layer of photosensitive composition is laminated to a printed circuit board precursor, typically a layer of copper on a dielectric support. The substrate is typically left in place as an oxygen barrier during imaging.

For lithographic printing, the substrate comprises a support, which may be any material conventionally used to prepare imageable elements useful as lithographic printing plates, with at least one hydrophilic surface. The layer of photosensitive material is over the hydrophilic surface. Typically the coating weight of the layer of photosensitive material is about 0.5 to about 4 $g/m^2$, preferably 0.8 to 3 $g/m^2$.

The substrate that comprises at least one hydrophilic surface comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 μm to about 600 μm. Typically, the substrate comprises an interlayer between the aluminum support and the layer of imageable composition. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and layer of imageable composition) may be coated with an antistatic agent and/or a slipping layer or matte layer to improve handling and "feel" of the imageable element.

Coversheet

The imageable element may also comprise a temporary coversheet over the layer of imageable composition. The coversheet protects the layer during storage and handling. Examples of suitable materials for the coversheet include thin films of polystyrene, polyethylene, polypropylene, polycarbonate, fluoropolymers, polyamide or polyester, which can be subbed with release layers.

Preparation of the Imageable Elements

The imageable element may be prepared by applying the layer of imageable composition over the surface of the substrate using conventional techniques.

The layer of imageable composition may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

The terms "solvent" and "coating solvent" include mixtures of solvents. They are used although some or all of the materials may be suspended or dispersed in the solvent rather than in solution. Selection of the solvent used to coat the layer of imageable composition depends on the nature of the ingredients present in the composition. Some common coating solvents are, for example, ethylene dichloride, cyclohexanone, methyl ethyl ketone, methanol, ethanol, 1-propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methylpyrolidone, dimethyl sulfoxide, sulfolane, gamma-butryolactone, toluene, acetone, and water. These solvents are used alone or as a mixture. Typical solvents or solvent mixtures are 1-methoxy-2-propanol, 1-methoxy-2-propanol/N,N-dimethyl formamide, 1-methoxy-2-propanol/water, 1-methoxy-2-propanol/-gamma-butryolactone/water, 1-methoxy-2-propanol/methanol/water.

Imaging and Processing

The coversheet, if present, is removed before imaging, typically by being peeled off. For some applications, such as photoresists for printed circuit boards, the resulting element may be laminated to a receptor, such as a printed circuit precursor, prior to imaging.

The imageable element may be imaged using ultraviolet radiation. Conventional ultraviolet sources include, for example, carbon arc lamps, mercury lamps, xenon lamps, tungsten lamps, and metal halide lamps. Imaging with these light sources is typically carried out by exposure through a photomask. Direct digital imaging, which obviates the need for exposure through a photomask, may be carried out with ultraviolet lasers.

Thermal imaging of the imageable element may be carried out by well-known methods. The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, typically at 830 nm or 1064 nm, is typically used for imaging thermally imageable elements. Imaging is conveniently carried out with a laser emitting at about 830 nm or at about 1064 nm. Suitable commercially available imaging devices include image setters such as the Creo Trendsetter (CREO) and the Gerber Crescent 42T (Gerber).

Alternatively, the imageable element may be thermally imaged using a conventional apparatus containing a thermal printing head. A suitable imaging apparatus includes at least one thermal head but would usually include a thermal head array, such as a TDK Model No. LV5416 used in thermal fax machines and sublimation printers or the GS618-400 thermal plotter (Oyo Instruments, Houston, Tex., USA).

After the imaging, the imaged imageable element may be heated. This optional heating step can be carried out by radiation, convection, contact with heated surfaces, for example, with rollers, or by immersion in a heated bath comprising an inert liquid, for example, water. Preferably, the imaged imageable element is heated in an oven.

The heating temperature is typically determined by the fog point of the imageable element. The fog point is defined as the lowest temperature, at a heating time of two minutes, required to render a thermally imageable element non-processable. When the imaged imageable element is heated above the fog point, the unimaged regions crosslink. Because they are not removed by developer, no image is formed.

Preferably, the temperature is about 28° C. (about 50° F.) or less below the fog point at a heating time of two minutes, more preferably about 17° C. (about 30° F.) or less below the fog point at a heating time of two minutes and most preferably about 8° C. (15° F.) below the fog point at a heating time of two minutes. Typically the heating temperature is about 110° C. to 150° C. (230° F. to 300° F.). The heating time can vary widely, depending on the method chosen for the application of heat as well as the other steps in the process. If a heat-transferring medium is used, the heating time will preferably be from about 30 seconds to about 30 minutes, more preferably from about 1 minute to about 5 minutes. When the imaged imageable element is heated in an oven, the heating time is preferably from about 1 minute to about 5 minutes.

Imaging produces an imaged element, which comprises a latent image of imaged (exposed) regions and complementary unimaged (unexposed) regions. Development of the imaged element to form a printing plate, or printing form, converts the latent image to an image by removing the unimaged (unexposed) regions, revealing the hydrophilic surface of the underlying substrate.

The developer may be any liquid or solution that can penetrate and remove the unexposed regions of the layer of imageable composition, without substantially affecting the complementary exposed regions. Suitable developers depend on the solubility characteristics of the ingredients present in the imageable element.

A conventional aqueous alkaline solution can be used as a developer or a replenisher. Examples include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Furthermore, also used are organic alkaline agents such as monomethyl amine, dimethyl amine, trimethyl amine, monoethyl amine, diethyl amine, triethyl amine, monoisopropyl amine, di-iso-propyl amine, triisopropyl amine, n-butyl amine, monoethanol amine, diethanol amine, triethanol amine, monoisopropanol amine, di-isopropyl amine, ethylene imine, ethylene diamine, and pyridine.

Useful developers are aqueous solutions having a pH of about 7 or above. Preferred aqueous alkaline developers are those that have a pH between 8 and about 13.5, typically at least about 11, preferably at least about 12. Useful developers include commercially available developers such as PC9000, PC3000, Goldstar™, Greenstar™, ThermalPro™, PROTHERM®, and MX1710, aqueous alkaline developers, each available from Kodak Polychrome Graphics LLC. Developers are described, for example, in Yamasue, U.S. Pat. No. 4,259,434; Seino, U.S. Pat. No. 4,4528,80; Miller, U.S. Pat. No. 5,851,735; Eckler, U.S. Pat. No. 5,998,102; Miro, EP-A-0732628, Toyama, GB-A-2276729; and Fiebag, U.S. Pat. No. 6,143,479.

Development is carried out for a long enough time to remove the unimaged regions of the layer of imageable composition, but not long enough to remove the imaged regions. The developer is typically applied to the imaged imageable element by spraying the element with sufficient force to remove the unexposed regions. Alternatively, development may be carried out in a processor or the imaged imageable element may be brushed with the developer. In each instance, a printing plate is produced. Development may conveniently be carried out in a commercially available spray-on processor, such the 85 NS (Kodak Polychrome Graphics) or the Unigraph Quartz K85 processor (Glunz & Jensen, Elkwood, Va., USA).

Optionally, the resulting printing plate may be baked to increase the run length of the plate. Baking can be carried out, for example at about 220° C. to about 240° C. for about 7 to 10 minutes, or at a temperature of 120° C. for 30 min. Although post-development baking is typically not necessary, it may be preferred for some applications.

Industrial Applicability

The imageable elements of the invention are useful in photomask lithography, imprint lithography, microelectronic and microoptical devices, photoresists for the preparation of printed circuit boards, and for the preparation of lithographic printing plate precursors.

The imageable elements are especially useful of the preparation of lithographic printing plate precursors. Once the imageable element has been imaged and developed to form a lithographic printing plate or printing form, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions of the layer of imageable composition not removed by the development process. The ink is then transferred to a suitable receiving material (such as cloth, paper, metal, glass or plastic) either directly or indirectly using an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention.

EXAMPLES

In the Examples, "coating solution" refers to the mixture of solvent or solvents and additives coated, even though some of the additives may be in suspension rather than in solution. Except where indicated, the indicated percentages are percentages by weight based on the total solids in the coating solution.

Glossary

BYK 307 Polyethoxylated dimethylpolysiloxane copolymer (Byk-Chemie, Wallingford, Conn., USA)
D11 Colorant dye (PCAS, Longjumeau, France)
DOWANOL® PM Propylene glycol methyl ether (Dow, Midland, Mich., USA)
N-13 Novolac resin; 100% m-cresol; MW 13,000 (Eastman Kodak Rochester, N.Y., USA)
Resole resin GP649D99 (Georgia-Pacific, Atlanta, Ga., USA)

Example 1

This example illustrates the synthesis of 2-methoxy-4-(phenylamino)-benzenediazonium, compound with, 2-[2-[2-chloro-3-[(1,3-dihydro-1,1,3-trimethyl-7-sulfo-2H-benz[e]indol-2-ylidene)ethylidene]-1-cyclohexen-1-yl]ethenyl]-1,1,3-trimethyl-7-sulfo-1H-benz[e]indolium inner salt.

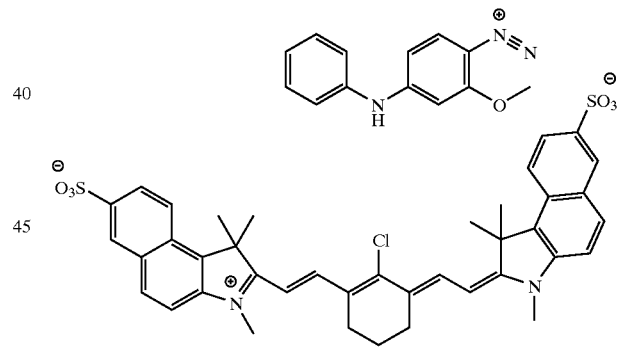

N,N-Dibutyl-1-butanamine, compound with, 2-[2-[2-chloro-3-[(1,3-dihydro-1,1,3-trimethyl-7-sulfo-2H-benz[e]indol-2-ylidene)ethylidene]-1-cyclohexen-1-yl]ethenyl]-1,1,3-trimethyl-7-sulfo-1H-benz[e]indolium inner salt (4.6 g) (Eastman Kodak, Rochester, N.Y., USA) was dissolved in 50 g of water and 150 g of DOWONOL® PM (Solution A). A solution of 3-methoxy-4-diazodiphenylamine bisulfate (2.1 g) (Diverstec, Fort Collins, Colo., USA) in 50 ml of water and 150 g of DOWONOL® PM, neutralized with 0.5 g of sodium bicarbonate in 5 ml water, was slowly added to Solution A with stirring. A precipitate was formed after mixing was completed. The resulting reaction mixture was stirred for another 10 minutes and stored in the dark at room temperature for 12 hours. The solid was collected by filtration and washed with 50 ml of acetone. After drying at ambient temperature for 12 hours, the yield was 4.4 g.

Proton NMR (in DMSO-d$_6$): δ 1.90 (2H, br), 1.95 (12H, s), 2.76 (4H, br), 3.81 (6H, br), 4.04 (3H, s), 6.34 (2H, d), 6.62 (1H, d), 6.90 (1H, d), 7.20–8.50 (18H, m), 10.77 (1H, s).

Example 2

This example illustrates the synthesis of 2-methoxy-4-(phenylamino)-benzenediazonium, compound with, 2-[2-[2-chloro-3-[(1,3-dihydro-1,1-dimethyl-7-sulfo-3-(2-sulfoethyl)-2H-benz[e]indol-2-ylidene)ethylidene]-1-cyclohexen-1-yl]ethenyl]-1,1-dimethyl-7-sulfo-3-(2-sulfoethyl)-1H-benz[e]indolium inner salt.

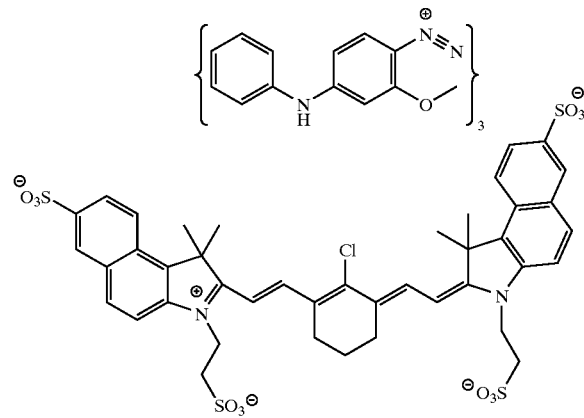

2-[2-[2-Chloro-3-[(1,3-dihydro-1,1-dimethyl-7-sulfo-3-(2-sulfoethyl)-2H-benz[e]indol-2-ylidene)ethylidene]-1-cyclohexen-1-yl]ethenyl]-1,1-dimethyl-7-sulfo-3-(2-sulfoethyl)-1H-benz[e]indolium inner salt, trisodium salt (3.0 g) (Eastman Kodak, Rochester, N.Y., USA) was dissolved in 150 g of water (Solution B). A solution of 3-methoxy-4-diazodiphenylamine bisulfate (3.0 g) in 40 ml of water, neutralized with 0.8 g of sodium bicarbonate in 10 ml water, was slowly added to Solution B with stirring. The reaction mixture was stirred for another 10 minutes and stored in the dark at room temperature for 12 hours. The solid was collected by filtration and washed with 50 ml of acetone. After drying at ambient temperature for 12 hours, the yield was 4.0 g.

Proton NMR (in acetone-d$_6$): δ 1.88 (2H, br), 1.93 (12H, s), 2.74 (4H, br), 2.99 (4H, t), 4.10 (9H, s), 4.50 (4H, br), 7.20-8.50 (38H, m), 10.73 (3H, s).

Example 3

This example illustrates the preparation and evaluation of an imageable element useful as a lithographic printing plate precursor.

A coating solution was prepared by dissolving 7.2 g of a DOWANOL® PM solution containing 25% of resole resin, 8.8 g of an acetone solution containing 35% N-13, 0.8 g of the compound prepared in Example 1, 0.07 g of D11, and 0.2 g of 10% BYK 307 in 45 g of 1-methoxy-2-propanol and 38 g of N,N-dimethylformamide. An electrochemically grained and anodized aluminum substrate, post-treated with polyvinylphosphoric acid, was coated with the above solution with a dry coating weight of about 1.4 g/m$^2$ (130 mg/ft$^2$). When dried with hot air at 88° C. (190° F.) for about 2 minutes on a rotating drum, the resulting imageable element was placed on a CREO Trendsetter 3244× image setter (CreoScitex, Burnaby, British Columbia, Canada) and imaged at 830 nm at a laser power of 5.5 W and a series of drum speeds from 60 to 250 rpm (exposure energy ranged from 50 to 210 mJ/cm$^2$).

The imaged imageable elements were preheated in a SPC Mini-HD Oven (Wisconsin Oven Corp., East Troy, Wis.) at 142° C. (287° F.) for about 2 minutes and were subsequently developed in an Unigraph Quartz K85 processor (Glunz & Jensen, Elkwood, Va., USA) charged with ThermalPro™ developer (Kodak Polychrome Graphics, Norwalk, Conn., USA) at 25° C. The minimum exposure energy required to achieve maximum processed density was about 65 mJ/cm$^2$. The printing plate produced by a 90 mJ/cm$^2$ exposure was mounted on a Miehle sheet-fed press to produce about 20,000 good impressions using a black ink containing 1.5% of calcium carbonate.

Example 4

This example illustrates the preparation and evaluation of an imageable element useful as a lithographic printing plate precursor.

A coating solution was prepared by dissolving 7.2 g of a DOWANOL® PM solution containing 25% of resole resin, 8.8 g of an acetone solution containing 35% N-13, 1.0 g of the compound prepared in Example 2, 0.07 g of D11, and 0.2 g of 10% BYK 307 in 45 g of 1-methoxy-2-propanol and 37 g of N,N-dimethylformamide.

An electrochemically grained and anodized aluminum substrate, post-treated with polyvinylphosphoric acid, was coated with the above solution with a dry coating weight of about 1.4 g/m$^2$ (130 mg/ft$^2$) when dried with hot air at 88° C. (190° F.) for about 2 minutes on a rotating drum. The resulting imageable element was placed on the CREO Trendsetter 3244× image setter and imaged at 830 nm at a laser power of 5.5 W and a series of drum speed from 60 to 250 rpm (exposure energy ranged from 50 to 210 mJ/cm$^2$). The imaged imageable elements were preheated in the SPC Mini-HD Oven at 138° C. (280° F.) for about 2 minutes and were subsequently developed in the Unigraph Quartz K85 processor charged with ThermalPro™ developer at 25° C.

The minimum exposure energy to achieve maximum processed density was about 65 mJ/cm$^2$. The printing plate produced by a 90 mJ/cm$^2$ exposure was mounted on a Miehle sheet-fed press to produce about 20,000 good impressions using a black ink containing 1.5% of calcium carbonate.

Example 5

This example illustrates the synthesis of 2-methoxy-4-(phenylamino)-benzenediazonium, compound with, 2-[2-[2-phenylthio-3-[(1,3-dihydro-3,3-dimethyl-1-(2-sulfoethyl)-2H-indol-2-ylidene)ethylidene]-1-cyclohexen-1-yl]ethenyl]-3,3-dimethyl-1-(2-sulfoethyl)-3H-indolium inner salt.

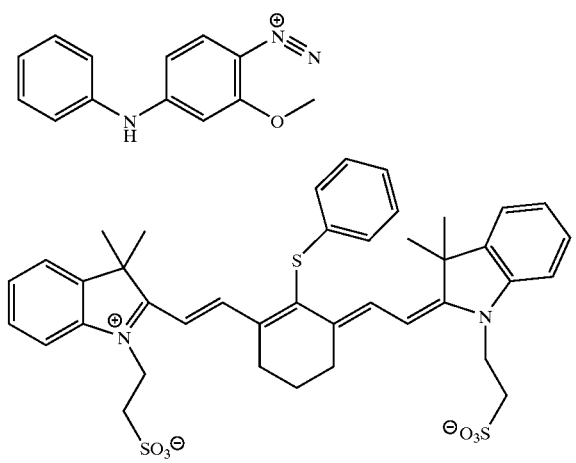

2-[2-[2-Phenylthio-3-[(1,3-dihydro-3,3-dimethyl-1-(2-sulfoethyl)-2H-indol-2-ylidene)ethylidene]-1-cyclohexen-1-yl]ethenyl]-3,3-dimethyl-1-(2-sulfoethyl)-3H-indolium sodium salt (0.8 g) (Eastman Kodak, Rochester, N.Y., USA) was dissolved in 30 g of water (Solution C). A solution of 3-methoxy-4-diazodiphenylamine bisulfate (0.33 g) (Diverstec, Fort Collins, Colo., USA) in 5 ml of water, neutralized with 0.1 g of sodium bicarbonate in 5 ml water, was slowly added to Solution C with stirring. The resulting reaction mixture was stirred for another 10 minutes and stored in the dark at room temperature for 12 hours. The product was collected by filtration, washed with 50 ml of water, and dried at ambient temperature for 12 hours. Yield: 0.87 g.

Example 6

This example illustrates the synthesis of 2-methoxy4-(phenylamino)-benzenediazonium, compound with, 2-[2-[2-diphenylamino-3-[[1,3-dihydro-1,1-dimethyl-7-sulfo-3-(3-sulfobutyl)-2H-benz[e]indol-2-ylidene]ethylidene]-1-cyclopenten-1-yl]ethenyl]-1,1-dimethyl-7-sulfo-3-(3-sulfobutyl)-1H-benz[e]indolium inner salt.

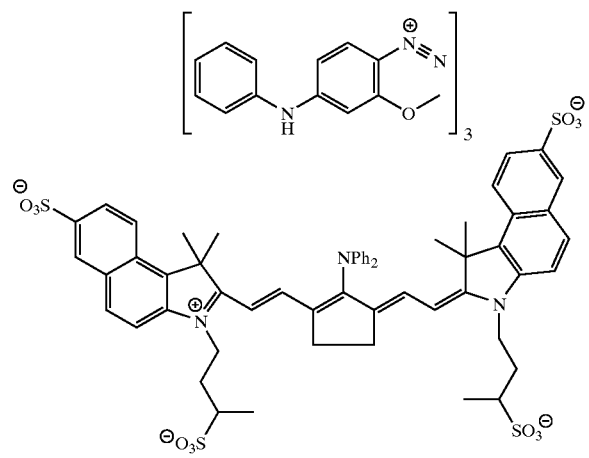

2-[2-[2-diphenylamino-3-[[1,3-dihydro-1,1-dimethyl-7-sulfo-3-(3-sulfobutyl)-2H-benz[e]indol-2-ylidene]ethylidene]-1-cyclopenten-1-yl]ethenyl]-1,1-dimethyl-7-sulfo-3-(3-sulfobutyl)-1H-benz[e]indolium trisodium salt (0.55 g) (Eastman Kodak, Rochester, N.Y., USA) was dissolved in 20 g of water (Solution D). A solution of 3-methoxy-4-diazodiphenylamine bisulfate (0.50 g) (Diverstec, Fort Collins, Co., USA) in 5 ml of water, neutralized with 0.15 g of sodium bicarbonate in 5 ml water, was slowly added to Solution D with stirring. The resulting reaction mixture was stirred for another 10 minutes and stored in the dark at room temperature for 12 hours. The product was collected by filtration, washed with 50 ml of water, and dried at ambient temperature for 12 hours. Yield: 0.58 g.

Example 7

This example illustrates the synthesis of 2-methoxy4-(phenylamino)-benzenediazonium, compound with, 2-[2-[2-chloro-3-[[1,3-dihydro-1,1-dimethyl-3-(3-sulfopropyl)-2H-benz[e]indol-2-ylidene]ethylidene]-1-cyclohexen-1-yl]ethenyl]-1,1-dimethyl-3-(3-sulfopropyl)-1H-benz[e]indolium inner salt

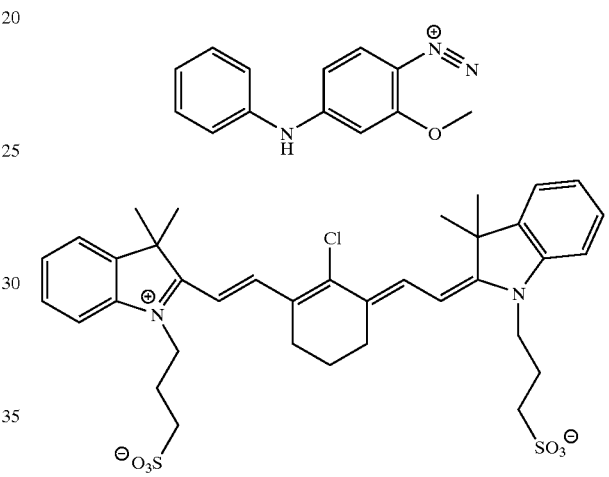

2-[2-[2-chloro-3-[[1,3-dihydro-1,1-dimethyl-3-(3-sulfopropyl)-2H-benz[e]indol-2-ylidene]ethylidene]-1-cyclohexen-1-yl]ethenyl]-1,1-dimethyl-3-(3-sulfopropyl)-1H-benz[e]indolium inner salt (0.71 g) (Eastman Kodak, Rochester, N.Y., USA) in 30 g of water was neutralized with 0.10 g of sodium bicarbonate in 5 ml water (Solution E). A solution of 3-methoxy-4-diazodiphenylamine bisulfate (0.33 g) (Diverstec, Fort Collins, Colo., USA) in 5 ml of water, neutralized with 0.10 g of sodium bicarbonate in 5 ml water, was slowly added to Solution E with stirring. The resulting reaction mixture was stirred for another 10 minutes and stored in the dark at room temperature for 12 hours. The product was collected by filtration, washed with 50 ml of water, and dried at ambient temperature for 12 hours. Yield: 0.62 g.

Example 8

This example illustrates the preparation and evaluation of an imaginable element useful as a lithographic printing plate precursor.

A coating solution was prepared by dissolving 3.4 g of a DOWANOL® PM solution containing 25% of resole resin, 4.4 g of an acetone solution containing 35% N-13, 0.4 g of the compound prepared in Example 5, 0.04 g of D11, and 0.1 g of 10% BYK 307 in 42 g of 1-methoxy-2-propanol and 5 g of gamma-butryolactone. An electrochemically grained and anodized aluminum substrate, post-treated with polyvinylphosphoric acid, was coated with the above solution with a dry coating weight of about 1.4 g/m² (130 mg/ft²) when dried with hot air at 88° C. (190° F.) for about 2 minutes on a rotating drum. The resulting imageable element was placed on the CREO Trendsetter 3244x image setter and imaged at 830 nm at a laser power of 5.5 W with a series of drum speeds from 60 to 250 rpm (exposure energy ranged from 50 to 210 mJ/cm²). The imaged imageable elements were preheated in the SPC Mini-HD Oven at 144° C. (292° F.) for about 2 minutes and were subsequently developed in the Unigraph Quartz K85 processor charged with ThermalPro™ developer at 25° C. The minimum exposure energy required to achieve maximum processed density was about 65 mJ/cm².

Example 9

This example illustrates the preparation and evaluation of an imaginable element useful as a lithographic printing plate precursor.

A coating solution was prepared by dissolving 3.4 g of a DOWANOL® PM solution containing 25% of resole resin, 4.4 g of an acetone solution containing 35% N-13, 0.4 g of the compound prepared in Example 6, 0.04 g of D11, and 0.1 g of 10% BYK 307 in 37 g of 1-methoxy-2-propanol, 5 g of water and 5 g of gamma-butryolactone. An electrochemically grained and anodized aluminum substrate, post-treated with polyvinylphosphoric acid, was coated with the above solution with a dry coating weight of about 1.4 g/m² (130 mg/ft²) when dried with hot air at 88° C. (190° F.) for about 2 minutes on a rotating drum. The resulting imageable element was placed on the CREO Trendsefter 3244x image setter imaged at 830 nm at a laser power of 5.5 W with a series of drum speeds from 60 to 250 rpm (exposure energy ranged from 50 to 210 mJ/cm²). The imaged imageable elements were preheated in the SPC Mini-HD Oven at 134° C. (273° F.) for about 2 minutes and were subsequently developed in the Unigraph Quartz K85 processor with ThermalPro™ developer at 25° C. The minimum exposure energy required to achieve maximum processed density was about 180 mJ/cm².

Example 10

This example illustrates the preparation and evaluation of an imaginable element useful as a lithographic printing plate precursor.

A coating solution was prepared by dissolving 3.4 g of a DOWANOL® PM solution containing 25% of resole resin, 4.4 g of an acetone solution containing 35% N-13, 0.4 g of the compound prepared in Example 7, 0.04 g of D11, and 0.1 g of 10% BYK 307 in 42 g of 1-methoxy-2-propanol and 5 g of water. An electrochemically grained and anodized aluminum substrate, post-treated with polyvinylphosphoric acid, was coated with the above solution with a dry coating weight of about 1.4 g/m² (130 mg/ft²) when dried with hot air at 88° C. (190° F.) for about 2 minutes on a rotating drum. The resulting imageable element was placed on the CREO Trendsetter 3244x image setter and imaged at 830 nm at a laser power of 5.5 W with a series of drum speeds from 60 to 250 rpm (exposure energy ranged from 50 to 210 mJ/cm²). The imaged imageable elements were preheated in the SPC Mini-HD Oven at 141° C. (285° F.) for about 2 minutes and were subsequently developed in the Unigraph Quartz K85 processor charged with ThermalPro™ developer 25° C. The minimum exposure energy required to achieve maximum processed density was about 130 mJ/cm².

Having described the invention, we now claim the following and their equivalents.

What is claimed is:

1. A method for forming images, the method comprising, in the order given, the steps of:
    a) imaging an imageable element and forming an imaged imageable element comprising unimaged regions and complementary imaged regions, and
    b) developing the imaged imageable element and removing the unimaged regions but not the complementary imaged regions;
in which:
    the imageable element comprises a substrate, and a layer of a negative working imageable composition over the substrate,
    the negative working imageable composition comprises:
        a polymeric binder;
        an acid activatable crosslinking agent; and
        an acid generator of the structure:

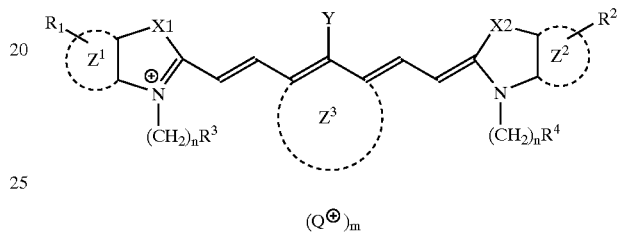

in which:
    Y is hydrogen, halo, alkyl, diphenylamino, phenylthio, or $(CH_2)_kSO_3^-$ in which k is 1 to 4;
    $R^1$, $R^2$, $R^3$, and $R^4$, are each independently hydrogen or $SO_3^-$ with the proviso that the anion has two to four $SO_3^-$ groups;
    $Z^1$ and $Z^2$ are each independently a benzo group or a naphtho group;
    $Z^3$ is two hydrogen atoms, a cyclohexene residue or a cyclopentene residue;
    X1 and X2 are each independently S, O, NH, $CH_2$, or $CMe_2$;
    $Q^\oplus$ is an onium cation;
    n is 1 to 4; and
    m is 1 to 3, with the proviso that m is 1 when the anion has two $SO_3^-$ groups; m is 2 when the anion has three $SO_3^-$ groups; and m is 3 when the anion has four $SO_3^-$ groups.

2. The method of claim 1 in which $R^1$ and $R^2$ are the same; $R^3$ and $R^4$ are the same; $Z^1$ and $Z^2$ are the same; X1 and X2 are the same; and $(CH_2)_nR^3$ and $(CH_2)_nR^4$ are the same.

3. The method of claim 2 in which:
    Y is hydrogen, chloro, phenylthio, or diphenylamino;
    $Z^3$ is a cyclohexene residue or a cyclopentene residue; and
    X1 and X2 are each $CMe_2$.

4. The method of claim 3 in which the polymeric binder is a novolac resin.

5. The method of claim 3 in which the acid activatable crosslinking agent is a resole resin.

6. The method of claim 5 in which the polymeric binder is a novolac resin.

7. The method of claim 1 in which the polymeric binder is a novolac resin.

8. The method of claim 1 in which the acid activatable crosslinking agent is a resole resin.

9. The method of claim 8 in which the polymeric binder is a novolac resin.

10. The method of claim 1 in which the imageable element is prepared by coating a coating solution comprising a coating solvent, the polymeric binder, the acid activatable crosslinking agent; and the acid generator onto the substrate.

11. The method of claim 10 in which the coating solvent is selected from the group consisting of 1-methoxy-2-propanol, 1-methoxy-2-propanol/N,N-dimethyl formamide, 1-methoxy-2-propanol/water, 1-methoxy-2-propanol/gamma-butryolactone/water, 1-methoxy-2-propanol/methanol/water.

12. The method of claim 11 in which the polymeric binder is a novolac resin and the acid activatable crosslinking agent is a resole resin.

13. The method of claim 12 in which:

$R^1$ and $R^2$ are the same; $R^3$ and $R^4$ are the same; $Z^1$ and $Z^2$ are the same; X1 and X2 are the same; and $(CH_2)_n R^3$ and $(CH_2)_n R^4$ are the same;

Y is hydrogen, chloro, phenylthio, or diphenylamino;

$Z^3$ is a cyclohexene residue or a cyclopentene residue; and

X1 and X2 are each $CMe_2$.

14. The method of claim 1 additionally comprising, after step a) and before step b), the step of heating the imaged imageable element.

15. The method of claim 14 in which the polymeric binder is a novolac resin.

16. The method of claim 15 in which the acid activatable crosslinking agent is a resole resin.

17. The method of claim 16 in which:

$R^1$ and $R^2$ are the same; $R^3$ and $R^4$ are the same; $Z^1$ and $Z^2$ are the same; X1 and X2 are the same; and $(CH_2)_n R^3$ and $(CH_2)_n R^4$ are the same;

Y is hydrogen, chloro, phenylthio, or diphenylamino;

$Z^3$ is a cyclohexene residue or a cyclopentene residue; and

X1 and X2 are each $CMe_2$.

18. The method of claim 14 in which the heating is at 110° C. to 150° C. for about 1 minute to about 5 minutes.

19. The method of claim 14 in which $R^1$ and $R^2$ are the same; $R^3$ and $R^4$ are the same; $Z^1$ and $Z^2$ are the same; X1 and X2 are the same; and $(CH_2)_n R^3$ and $(CH_2)_n R^4$ are the same.

* * * * *